United States Patent
Ziemkowski

(10) Patent No.: US 6,294,742 B1
(45) Date of Patent: Sep. 25, 2001

(54) APPARATUS AND METHOD FOR ADAPTING SURFACE MOUNT SOLDER PAD FOR HEAT SINK FUNCTION

(75) Inventor: Ted B Ziemkowski, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/363,497

(22) Filed: Jul. 27, 1999

(51) Int. Cl.[7] ............................ H05K 1/00; H01R 9/09
(52) U.S. Cl. .................... 174/261; 174/252; 174/260; 174/50.1; 361/719; 361/743; 361/760; 361/777; 165/185
(58) Field of Search .................. 174/261, 252, 174/260, 250, 267, 52.1, 52.4; 361/760, 704, 705, 767, 768, 808, 717, 718, 719, 720, 783, 709, 743, 777; 165/80.2, 80.3, 185

(56) References Cited

U.S. PATENT DOCUMENTS

| | | | |
|---|---|---|---|
| 4,413,309 | * 11/1983 | Takahashi et al. | 361/774 |
| 4,758,459 | * 7/1988 | Mehta | 428/131 |
| 4,851,966 | * 7/1989 | Roback et al. | 361/774 |
| 4,854,040 | * 8/1989 | Turek | 29/847 |
| 5,172,852 | * 12/1992 | Bernardoni et al. | 228/180.21 |
| 5,203,077 | * 4/1993 | Reddy | 29/840 |
| 5,726,861 | * 3/1998 | Ostrem | 361/767 |
| 5,729,438 | * 3/1998 | Pieper et al. | 361/760 |
| 5,742,483 | 4/1998 | Ma et al. | 361/777 |
| 5,804,873 | 9/1998 | Pelly | 257/675 |
| 5,973,932 | * 10/1999 | Nguyen | 361/779 |
| 6,115,262 | * 9/2000 | Brunner et al. | 361/774 |
| 6,133,134 | * 10/2000 | Mehr | 438/612 |
| 6,169,253 | * 1/2001 | Jairazbhoy et al. | 174/250 |

\* cited by examiner

Primary Examiner—Jeffrey Gaffin
Assistant Examiner—I B Patel
(74) Attorney, Agent, or Firm—Jack A. Lenell

(57) ABSTRACT

A surface mount solder pad that is adapted to function as a heat sink for an electronic component soldered to the pad. Included is a printed wiring board having solder pads disposed on its surface that are adapted for soldering to leads of surface mount components. The solder pads are electrically interconnected by conductive traces also disposed on the surface. At least one of the solder pads has an enhanced surface area that is selected larger than necessary for the soldering, and that is selected sufficiently large so as to sink enough heat generated by one of the surface mount components to provide for its proper operation.

34 Claims, 3 Drawing Sheets

APPARATUS AND METHOD FOR ADAPTING SURFACE MOUNT SOLDER PAD FOR HEAT SINK FUNCTION

FIELD OF THE INVENTION

The invention is generally directed to surface mount circuit board technology, and more particularly is directed to surface mount solder pads used in circuit boards for electrically interconnecting electronic components.

BACKGROUND OF THE INVENTION

Surface mount circuit board technology provides a number of advantages over older, so called "through-hole" circuit board technology. Such advantages include higher electronic component density, lower costs, and ease of manufacturing. While, surface mount circuit boards provide some advantages, some challenges still remain.

Some electronic components, such as high power transistors, high power devices, and the like benefit from some sort of heat sink to ensure proper intended operation. Even operation of lower power devices may benefit somewhat from use in conjunction with heat sinks. Through-hole circuit boards easily accommodate mounting of separate massive aluminum heat sinks on the circuit boards. However, it is much more difficult to mount such massive aluminum heat sinks on surface mount circuit boards.

Additionally, because of the higher component density employed in surface mount circuit boards, there is less space available for separate heat sinks. Such circuit boards devote a significant amount of space to a large number of surface mount solder pads. The solder pads, typically made of copper or gold, are used for soldering to leads of the electronic components, and are interconnected by conductive circuit traces.

In much of the prior art, surface mount solder pads are made as small as possible, so as to provide for the higher component density. As a general matter, in such cases the solder pads are often no larger than necessary for the soldering.

What is needed is a surface mount solder pad that is adapted to function as a heat sink for an electronic component soldered to the pad.

SUMMARY OF THE INVENTION

The invention provides a surface mount solder pad that is adapted to function as a heat sink for an electronic component soldered to the pad. Accordingly, the invention advantageously provides for reasonably high electronic component density, low cost, and ease of manufacturing, while still providing for proper intended component operation.

Many surface mount components, such as high power surface mount transistors, high power surface mount devices, and the like generate excess heat and therefore benefit from the teachings of the invention. For example, a surface mount component such as a surface mount power MOSFET (Metal Oxide Semiconductor Field Effect Transistors) or the like benefits in that the solder pad of the invention has an enhanced surface area that is sufficiently large (to sink enough excess heat generated by the component) so as to provide for the component's proper intended operation.

In much of the prior art, surface mount solder pads are often no larger than necessary for soldering. However, it should be understood that improper operation such as so called "thermal runaway", as well as component damage could possibly result in some cases, if solder pads are made too small, and the teachings of the invention are not employed.

Briefly and in general terms the method and apparatus of the invention include providing a printed wiring board having solder pads disposed on its surface that are adapted for soldering to leads of surface mount components. The solder pads are electrically interconnected by conductive traces also disposed on the surface. At least one of the solder pads has the enhanced surface area that is selected larger than necessary for the soldering, and that is selected sufficiently large so as to sink enough heat generated by the one of the surface mount components to provide for its proper operation. Such solder pad includes a major surface having features extending into the major surface, so as to provide for the enhanced surface area.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1A:
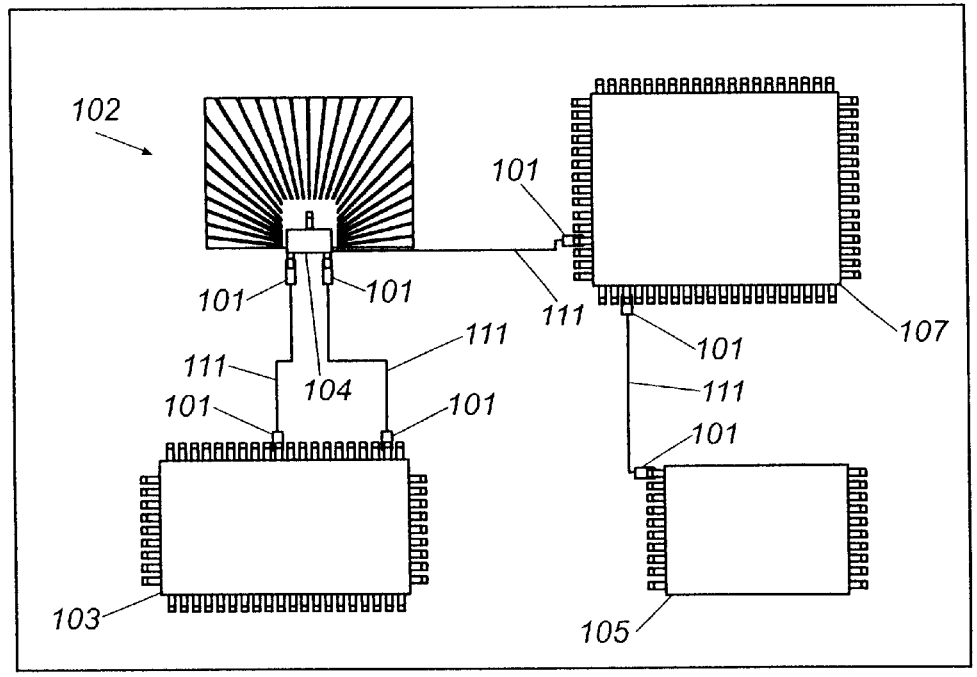
FIG. 1A shows a simplified plan view of a preferred embodiment of the invention.

FIG. 1A shows a simplified plan view of a printed wiring board 100 of a preferred embodiment of the invention. Solder pads 101, 102 are disposed on its surface that are adapted for soldering to leads of surface mount components 103, 105, 107, 109. The solder pads are electrically interconnected by conductive traces 111 also disposed on the surface of the circuit board. For the sake of simplicity, fewer solder pads and components and conductive traces are representatively illustrated in the figures than are employed for the preferred embodiment.

Figure 1B:
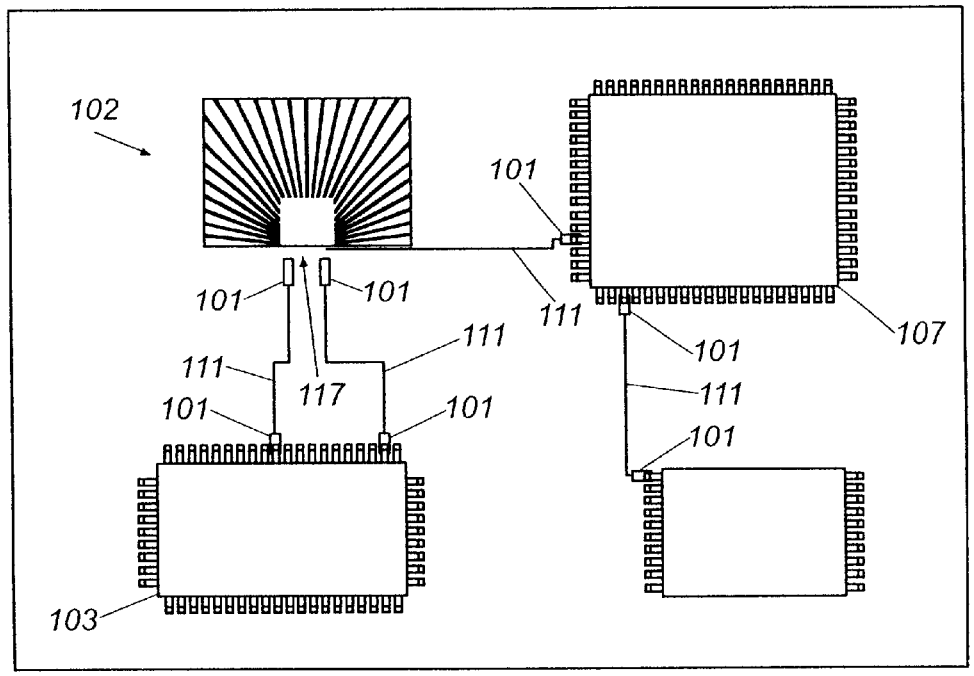
FIG. 1B shows the invention as in FIG. 1A but with one of the surface mount components removed.

The solder pads 101, 102 include at least one solder pad 102 that has an enhanced surface area that is selected larger than necessary for the soldering one of the surface mount components (such as a power MOSFET 109.) The enhanced surface area of the solder pad 102 is selected sufficiently large so as to sink enough heat generated by the power MOSFET 109 so as to provide for its proper intended operation. FIG. 1B shows the invention as in FIG. 1A, but with one of the surface mount components, the power MOSFET 109, removed so as to provide a better view of the enhanced surface area of the solder pad 102.

Figure 2A:
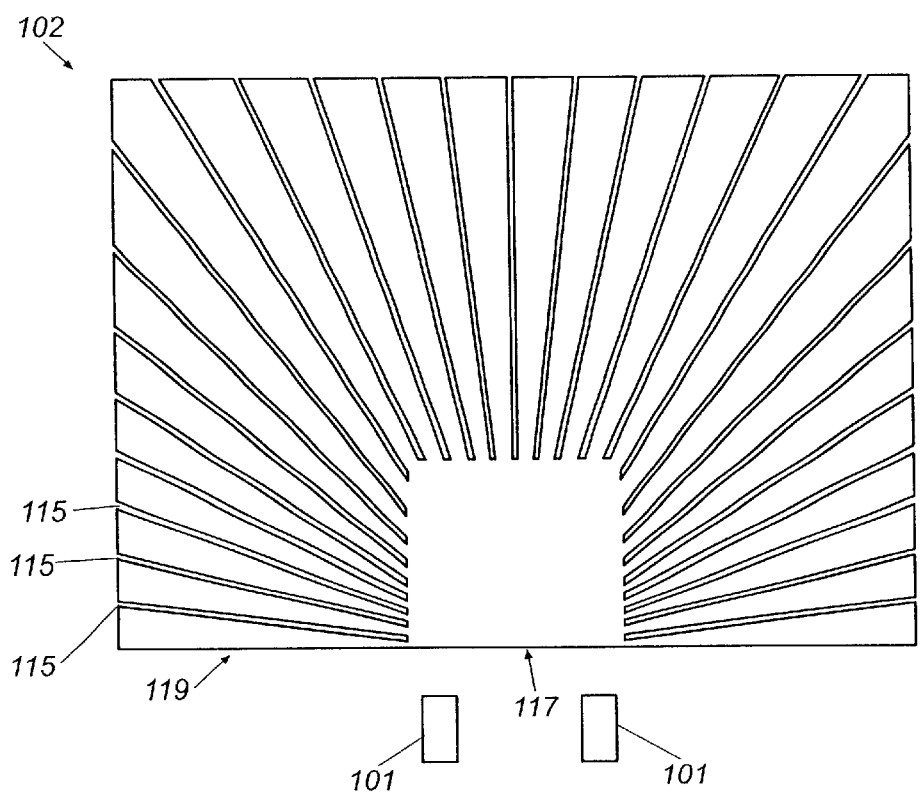
FIG. 2A shows a simplified detailed plan view of a solder pad of the invention having an enhanced surface area.
Figure 2B:
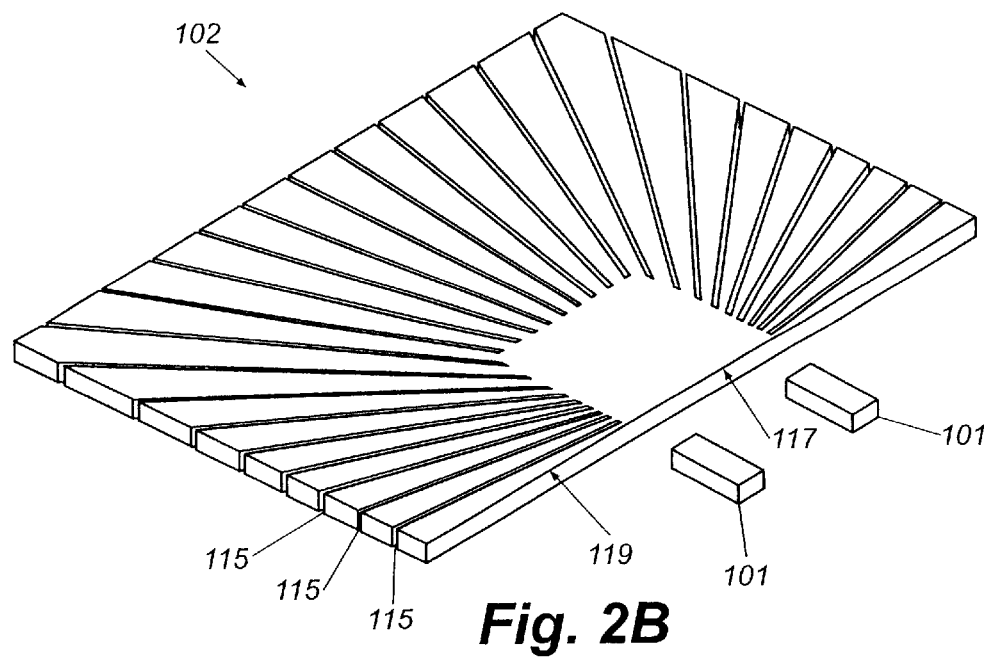
FIG. 2B shows a simplified detailed isometric view of the solder pad shown in FIG. 2A.

FIG. 2A shows a simplified detailed plan view of the solder pad 102 having the enhanced surface area as in FIGS. 1A and 1B. FIG. 2B shows a simplified detailed isometric view of the solder pad 102 of FIG. 2A. As shown in the figures, the solder pad 102 includes a major surface having features extending into the major surface, so as to provide for the enhanced surface area.

In the preferred embodiment, the features are embodied as trenches 115 extending into the major surface, wherein the trenches are arranged extending radially outward from a bonding region 117 of the solder pad though a complementary region 119 of the solder pad. As explained in further detail subsequently herein, this radial arrangement of the invention advantageously provides a substantially uniform thermal resistance.

Excess heat generated by the power MOSFET flows through the lead of the MOSFET to where the lead is soldered to the bonding region 117 of the solder pad. The radial arrangement of the trenches promotes efficient heat flow by providing substantially uniform thermal resistance as heat flows outwardly from the bonding region 117 through the complementary region 119.

In the preferred embodiment, density of the trenches (extending radially) is substantially within a range from approximately seventy five trenches per one and one half pi radians around the bonding region 117 to approximately six hundred trenches per one and one half pi radians around the bonding region 117. It is theorized by the inventor that if the density is substantially less than approximately seventy five trenches per one and one half pi radians, then the trenches do not sufficiently enhance the surface area of the solder pad to accomplish the purposes of the invention.

While increasing the density of the trenches provides some advantages in further enhancing the surface area of the solder pad, it also may make fabrication more difficult. In particular, when the trenches are etched, excessively increasing the density of the trenches leads to over-etching, so that the bonding region is no longer contiguous with some or all the complementary region, which in turn substantially impairs the desired heat flow from the bonding region through the complementary region. It is theorized by the inventor that if the density is substantially more than approximately six hundred trenches per one and one half pi radians, then significant manufacturing difficulties may result. For the sake of simplicity, a fewer number of trenches and a corresponding lower density are representatively illustrated in the figures.

For similar reasons as those just discussed with respect to trench density, in the preferred embodiment a respective width of each trench is substantially within a range from approximately one mil (0.001 inches) to approximately eight mils (0.008 inches). It is theorized by the inventor that if the trench width is substantially more than approximately eight mills, then the trenches do not sufficiently enhance the surface area of the solder pad for the purposes of the invention discussed previously herein. It is theorized by the inventor that if the trench width is substantially less than approximately one mil, then significant manufacturing difficulties may result.

Preferably, the solder pad 102 has a thickness dimension substantially within a range from approximately one mil to approximately four mils. It is theorized by the inventor that if the thickness of the solder pad is substantially less than approximately one mi, then manufacturing difficulties may result. It is theorized by the inventor that if the thickness of the solder pad is substantially more than approximately four mils, then manufacturing costs may increase significantly. In the preferred embodiment, the solder pad 102 has a thickness dimension of approximately two mils, which provides an advantageous balance between manufacturing ease and low cost.

Preferably, the features 115 extend into the major surface an amount substantially within a range from approximately fifty percent to approximately one hundred percent of the thickness dimension of the solder pad. It is theorized by the inventor that if the features extend substantially less than approximately fifty percent, then the features do not sufficiently enhance the surface area of the solder pad for the purposes of the invention.

Figures 3, 4:
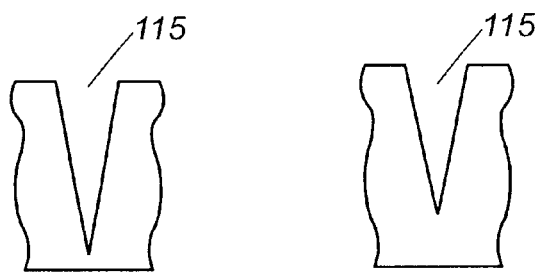
FIGS. 3 and 4 are further detailed cross sectional views, showing features of the invention varied based on etching time.

The enhancement of the surface area is maximized as feature extension approaches one hundred percent of pad thickness, as in the preferred embodiment. However manufacturing difficulties, including a risk of over-etching, also increase as feature extension approaches one hundred percent. Accordingly, in another preferred embodiment, the features extend approximately eighty five percent of the pad thickness, so as to provide for ease of manufacturing. FIGS. 3 and 4 are further detailed cross sectional views, illustrating pad thickness and varied amounts of extension of one of the features 115, based on etching time in accordance with the principles of the invention.

Figure 5:
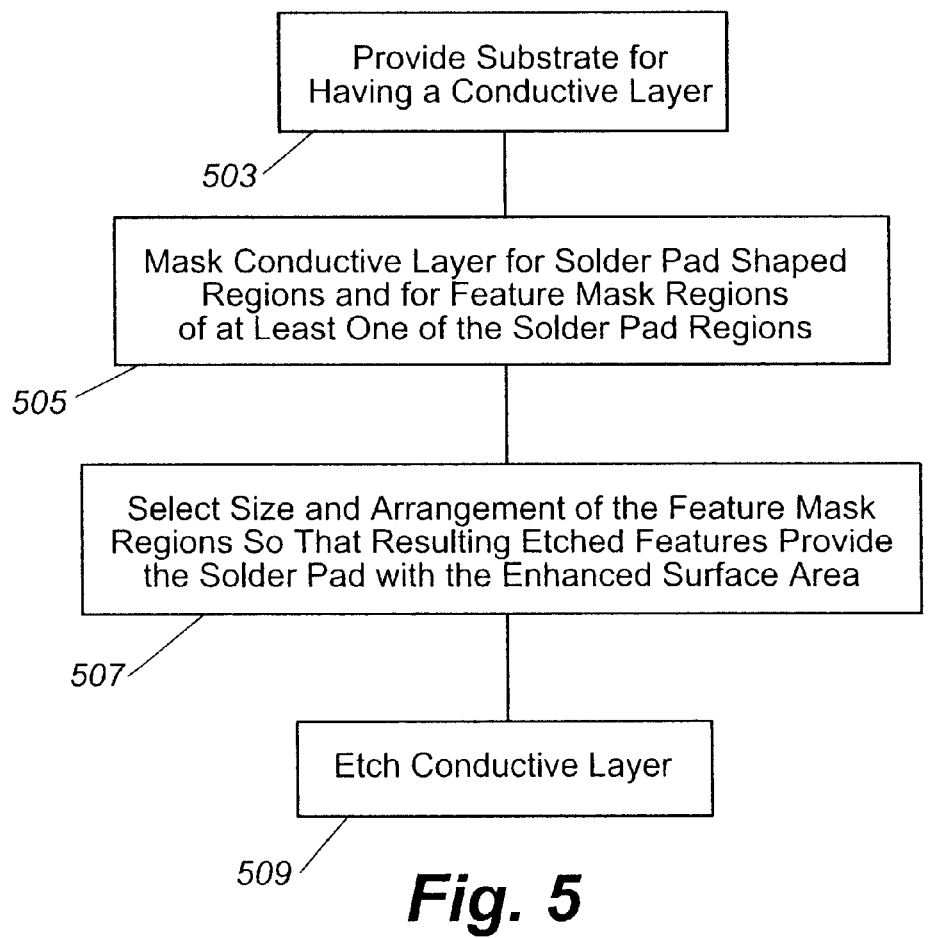
FIG. 5 is a flowchart illustrating a preferred method for making the printed wiring board in accordance with the principles of the invention.

Preferably, in fabricating the printed wiring board having the novel aspects of the invention discussed previously herein, some skills with respect to use of photoresist, masking and etching that are well known in the art should be leveraged in conjunction with novel processes of the invention. FIG. 5 is a flowchart illustrating a preferred method 500 for making the printed wiring board in accordance with the principles of the invention.

As shown in block 503 of FIG. 5, a substrate for the printed wiring board, for example fiberglass, is provided having a conductive layer disposed thereon, for example a copper layer. As shown in block 505, the conductive layer is masked with photoresist in such a way so as to provide etch resistance to solder pad shaped regions interconnected by conductive trace shaped regions of the conductive layer. This masking step includes masking at least one of the solder pad shaped regions so as to provide etch resistance to feature mask regions within that solder pad region.

As shown in block 507, a size and arrangement of the feature mask regions are selected. As shown in block 509, the masked conductive layer is etched so as to produce the printed wiring board including the solder pads electrically interconnected by conductive traces.

The etching as in block 509 includes etching the features adjacent to the feature mask regions. In block 507, size and arrangement of the feature mask regions are selected so that the resulting etched features provide the solder pad with the enhanced surface area. Preferably, the etching is done for a sufficiently short period of time to avoid over-etching, so that the bonding region of the solder pad, adjacent to the features, remains contiguous with the complementary region of the solder pad. Additionally, it is preferred that etching is done for a sufficiently long period of time so that the features extending into the major surface of the solder pad extend approximately eighty five percent through the thickness of the solder pad.

For example, in one of the preferred embodiments: the major surface of the solder pad into which the features extend measures approximately one inch by approximately one inch; the solder pad is made of copper approximately two mils thick; the preferred features of approximately one hundred and fifty trenches each having a width of approximately one and one half mills are radially arranged having a density of approximately one hundred and fifty trenches per one and one half pi radians around the bonding region; and the solder pad is etched in an etchant bath of an aqueous solution including approximately thirty percent ammonia (or other suitable commercially available etchant), at a bath temperature of approximately one hundred and twenty four degrees Fahrenheit, for a time period of approximately one and a half minutes. It is theorized by the inventor that under these conditions, this time period is sufficiently short so as to avoid the over-etching, but is sufficiently long so that the trenches extend approximately eighty five percent through the thickness of the solder pad.

Under these conditions, it is estimated that the one hundred and fifty trenches advantageously enhance the surface area of the solder pad by approximately sixteen percent, so as to enhance cooling efficiency as the solder pad is adapted to function as a heat sink. For example, where the surface mount component is a Motorola MTD 3055VL surface mount power n-channel MOSFET generating approximately one and three quarters Watts of excess heat during operation, under these conditions the enhanced surface area of the solder pad is sufficiently large (to sink enough excess heat generated by the component) so as to provide for the component's proper intended operation (in this case, undamaged operation) at ambient room temperature.

It should be understood that although the etching as in block 509 is preferably kept as simple as possible, within the scope of the invention the etching in block 509 is construed broadly in light of modern printed circuit board fabrication techniques. Accordingly, in some embodiments the etching in block 509 broadly includes techniques that break etching down into various combinations of sub-steps of etching in the etchant bath and back-plating in a plating bath.

As fully discussed previously herein, the invention provides a surface mount solder pad that is adapted to function as a heat sink for an electronic component soldered to the pad. Although specific embodiments of the invention have been described and illustrated, the invention is not to be limited to the specific forms or arrangements parts so described and illustrated, and various modifications and changes can be made without departing from the scope and spirit of the invention. For example, the invention is not strictly limited to radial trench features since it is theorized by the inventor that alternative arrangements and feature shapes such as those having circular or "polka-dot" cross section and extending into the major surfaced of the solder pad may be employed with beneficial results. Within the scope of the appended claims, therefor, the invention may be practiced otherwise than as specifically described and illustrated.

What is claimed is:

1. An apparatus comprising:
    a printed wiring board having a surface, including solder pads electrically interconnected by conductive traces each disposed on the surface,
    wherein the solder pads are adapted for soldering to leads of surface mount components, and
    wherein at least one of the solder pads has an enhanced surface area that is selected larger than necessary for the soldering, and that is sufficiently large so as to sink enough heat generated by one of the surface mount components to provide for its proper operation.

2. An apparatus as in claim 1 wherein said at least one of the solder pads includes a major surface having features extending into the major surface, so as to provide for the enhanced surface area.

3. An apparatus as in claim 1 wherein said at least one of the solder pads includes a major surface having features etched into the major surface, so as to provide for the enhanced surface area.

4. An apparatus as in claim 1 wherein said at least one of the solder pads includes a major surface having trenches extending into the major surface, so as to provide for the enhanced surface area.

5. An apparatus as in claim 1 wherein said at least one of the solder pads includes a major surface having trenches etched into the major surface, so as to provide for the enhanced surface area.

6. An apparatus as in claim 1 wherein said at least one of the solder pads includes a major surface having features extending into the major surface and extending approximately one hundred percent through a thickness of said pad, so as to provide for the enhanced surface area.

7. An apparatus as in claim 1 wherein said at least one of the solder pads includes a major surface having features etched into the major surface and etched entirely through said pad, so as to provide for the enhanced surface area.

8. An apparatus as in claim 1 wherein said at least one of the solder pads includes a major surface having trenches extending into the major surface and extending approximately one hundred percent through a thickness of said pad, so as to provide for the enhanced surface area.

9. An apparatus as in claim 1 wherein said at least one of the solder pads includes a major surface having trenches etched into the major surface and etched approximately one hundred percent through said pad, so as to provide for the enhanced surface area.

10. An apparatus as in claim 1 wherein said at least one of the solder pads has a thickness dimension substantially within a range from approximately one mil to approximately four mils.

11. An apparatus as in claim 1 wherein said at least one of the solder pads has a thickness dimension of approximately two mils.

12. An apparatus as in claim 1 wherein said at least one of the solder pads includes a major surface having features extending into the major surface an amount substantially within a range from approximately fifty percent to approximately one hundred percent of a thickness dimension of the solder pad.

13. An apparatus as in claim 1 wherein said at least one of the solder pads includes a major surface having features extending into the major surface an amount of approximately eighty five percent.

14. An apparatus as in claim 1 wherein said at least one of the solder pads includes a major surface having trenches extending into the major surface, and wherein the trenches are arranged extending radially outward from a bonding region of the solder pad though a complementary region of the solder pad, so as to provide a substantially uniform thermal resistance as heat flows outwardly from the bonding region through the complementary region.

15. An apparatus as in claim 1 wherein said at least one of the solder pads includes a major surface having trenches extending into the major surface, wherein the trenches are arranged extending radially outward from a bonding region of the major surface, and wherein a density of the trenches extending radially is substantially within a range from approximately seventy five trenches per one and one half pi radians around the bonding region to approximately six hundred trenches per one and one half pi radians around the bonding region.

16. An apparatus as in claim 1 wherein said at least one of the solder pads includes a major surface having trenches extending into the major surface, wherein the trenches are arranged extending radially outward from a bonding region of the major surface, and wherein a density of the trenches extending radially is approximately one hundred and fifty trenches per one and one half pi radians around the bonding region.

17. An apparatus as in claim 1 wherein said at least one of the solder pads includes a major surface having trenches extending into the major surface, wherein a respective width of each trench is substantially within a range from approximately one mil to approximately eight mils.

18. An apparatus comprising:

a printed wiring board having solder pads, wherein at least one of said solder pads is adapted for use as a heat sink for attached surface mount components;

wherein a substrate is provided having a conductive layer disposed thereon;

wherein said solder pads are electrically interconnected by conductive traces each disposed on said substrate;

wherein said solder pads are adapted for soldering to leads of surface mount components;

wherein said solder pad adapted for use as a heat sink has an enhanced surface area being selected larger than necessary for soldering; and wherein said solder pad adapted for use as a heat sink is of sufficient size to sink enough heat generated by said attached surface mount components to provide for its proper operation.

19. An apparatus as in claim 18 wherein said solder pad adapted for use as a heat sink includes a major surface wherein sufficient material has been removed from the conductive layer comprising the major surface, so as to provide for said enhanced surface area.

20. An apparatus as in claim 18 wherein said solder pad adapted for use as a heat sink includes a major surface having features etched into the major surface, so as to provide for said enhanced surface area.

21. An apparatus as in claim 18 wherein said solder pad adapted for use as a heat sink includes a major surface having features extending into the major surface, so as to provide for said enhanced surface area.

22. An apparatus as in claim 18 wherein said solder pad adapted for use as a heat sink includes a major surface having trenches etched into the major surface, so as to provide for said enhanced surface area.

23. An apparatus as in claim 18 wherein said solder pad adapted for use as a heat sink includes a major surface having features extending into the major surface and extending approximately one hundred percent through a thickness of said solder pad, so as to provide for said enhanced surface area.

24. An apparatus as in claim 18 wherein said solder pad adapted for use as a heat sink includes a major surface having features etched into the major surface and entirely through said solder pad, so as to provide for said enhanced surface area.

25. An apparatus as in claim 18 wherein said solder pad adapted for use as a heat sink includes a major surface having trenches extending into the major surface and extending approximately one hundred percent through a thickness of said solder pad, so as to provide for said enhanced surface area.

26. An apparatus as in claim 18 wherein said solder pad adapted for use as a heat sink includes a major surface having trenches etched into the major surface and etched approximately one hundred percent through said pad, so as to provide for said enhanced surface area.

27. An apparatus as in claim 18 wherein said solder pad adapted for use as a heat sink has a thickness dimension substantially within a range from approximately one mil to approximately four mils.

28. An apparatus as in claim 18 wherein said solder pad adapted for use as a heat sink has a thickness dimension of approximately two mils.

29. An apparatus as in claim 18 wherein said solder pad adapted for use as a heat sink includes a major surface having features extending into the major surface an amount substantially within a range of approximately fifty percent to approximately one hundred percent of a thickness dimension of said solder pad.

30. An apparatus as in claim 18 wherein said solder pad adapted for use as a heat sink includes a major surface having features extending into the major surface an amount of approximately eighty five percent.

31. An apparatus as in claim 18 wherein said solder pad adapted for use as a heat sink includes a major surface having trenches extending into the major surface, and wherein the trenches are arranged extending radially outward from a bonding region of said solder pad through a complementary region of said solder pad, so as to provide a substantially uniform thermal resistance as heat flows outwardly from the bonding region through the complementary region.

32. An apparatus as in claim 18 wherein said solder pad adapted for use as a heat sink includes a major surface having trenches extending into the major surface, wherein the trenches are arranged extending radially outward from a bonding region of said solder pad, and wherein a density of the trenches extending radially is substantially within a range from approximately seventy five trenches per one and one half pi radians around the bonding region to approximately six hundred trenches per one and one half pi radians around the bonding region.

33. An apparatus as in claim 18 wherein said solder pad adapted for use as a heat sink includes a major surface having trenches extending into the major surface, wherein the trenches are arranged extending radially outward from a bonding region of the major surface, and wherein a density of the trenches extending radially is approximately one hundred and fifty trenches per one and one half pi radians around the bonding region.

34. An apparatus as in claim 18 wherein said solder pad adapted for use as a heat sink includes a major surface having trenches extending into the major surface, wherein a respective width of each of said trenches is substantially within a range of approximately one mil to approximately eight mils.

* * * * *